US008577052B2

(12) United States Patent
Silber et al.

(10) Patent No.: US 8,577,052 B2
(45) Date of Patent: Nov. 5, 2013

(54) HEADPHONE ACCESSORY

(75) Inventors: Michael W. Silber, Dix Hills, NY (US); Christopher M. Dragon, Huntington Station, NY (US)

(73) Assignee: Harman International Industries, Incorporated, Stamford, CT (US)

( * ) Notice: Subject to any disclaimer, the term of this patent is extended or adjusted under 35 U.S.C. 154(b) by 1269 days.

(21) Appl. No.: 12/266,228

(22) Filed: Nov. 6, 2008

(65) Prior Publication Data

US 2010/0111337 A1    May 6, 2010

(51) Int. Cl.
*H04R 1/10*    (2006.01)
(52) U.S. Cl.
USPC ........... 381/74; 381/71.1; 381/94.1; 381/119; 381/122; 381/123
(58) Field of Classification Search
USPC ................ 381/1, 18, 309, 311, 319, 74, 71.6, 381/94.8, 110, 123, 71.1, 94, 94.7, 94.5, 381/104, 119, 122, 370, 182, 373
See application file for complete search history.

(56) References Cited

U.S. PATENT DOCUMENTS

| 4,817,149 | A * | 3/1989 | Myers ............................... 381/1 |
| 5,694,467 | A * | 12/1997 | Young, III ..................... 379/430 |
| 5,887,066 | A * | 3/1999 | Nakagawa ..................... 381/311 |
| 6,311,155 | B1 * | 10/2001 | Vaudrey et al. ............... 704/225 |
| 6,381,333 | B1 * | 4/2002 | Suzuki ............................ 381/18 |
| 6,650,755 | B2 * | 11/2003 | Vaudrey et al. ................. 381/18 |
| 6,782,106 | B1 * | 8/2004 | Kong et al. ..................... 381/74 |
| 8,041,057 | B2 * | 10/2011 | Xiang et al. .................. 381/119 |
| 2003/0016830 | A1 * | 1/2003 | Nakamichi ..................... 381/18 |
| 2003/0035551 | A1 * | 2/2003 | Light et al. ................... 381/71.6 |
| 2005/0207597 | A1 * | 9/2005 | Kageyama ..................... 381/119 |
| 2006/0050890 | A1 * | 3/2006 | Tsuhako ......................... 381/27 |
| 2006/0233394 | A1 * | 10/2006 | Lehmkuhl ..................... 381/119 |
| 2007/0162169 | A1 * | 7/2007 | Watanuki ........................ 700/94 |
| 2009/0046868 | A1 * | 2/2009 | Engle et al. .................... 381/74 |

* cited by examiner

*Primary Examiner* — Cuong Q Nguyen
*Assistant Examiner* — Galina Yushina
(74) *Attorney, Agent, or Firm* — Brooks Kushman P.C.

(57) ABSTRACT

A headphone accessory for use with a portable audio device and headphones. The headphone accessory includes an audio source input for receiving audio signals from an audio device. An audio sound transducer receives external sounds and converts the external sound to external sound signals. A signal mixer for continuously varies the balance of a source audio volume to an external sound volume. The signal mixer mixes the volume-adjusted source audio signals with volume-adjusted external sound signals. An audio output outputs the mixed source audio and external sound signals.

20 Claims, 4 Drawing Sheets

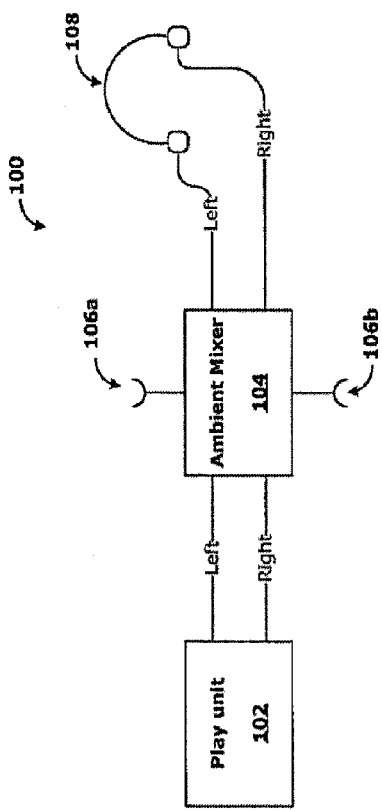
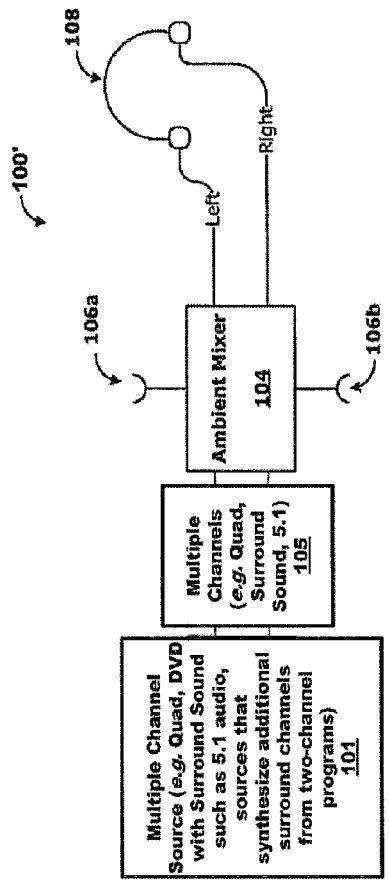

HEADPHONE ACCESSORY

BACKGROUND OF THE INVENTION

1. Field of the Invention

This invention relates generally to audio systems, and more particularly to portable audio speakers.

2. Related Art

The continuing miniaturization of electronic devices has led to a variety of portable audio devices that deliver audio to a listener via headphones. Portable radios have evolved from AM and/or FM radios to more recently available portable satellite radios. Portable audio devices are also available for playing audio tapes, compact discs (CDs), mini-audio discs, and more recently, audio recorded on solid state or magnetic storage devices. Examples of solid state and magnetic storage devices include the iPod™ from Apple.

The miniaturization of electronics has also led to smaller and smaller headphones that produce high quality sound. Even earphones, or headphones that plug directly into the user's ears, are now capable of delivering rich, high quality sound that silences external sounds generated in the user's environment.

Portable audio devices now offer users a virtually unlimited selection of audio sound and music as well as the ability to listen to such audio and music through high quality sound sources. Portable audio devices have become so advanced and so small that users "wear" their portable audio devices while engaged in a wide variety of activities such as exercising, commuting, working, etc.

Users often use their portable audio devices in situations in which the advantages of rich sound that silences external sound from the user may actually be a shortcoming. For example, there may be safety reasons for why a user should be able to hear noise generated in his environment. Such situations may include for example, if a user is running for exercise outdoors, and there may be areas of traffic in which the user may need to hear the sounds generated in the environment to avoid being involved in an accident. It may also be desirable in situations for a user to be able to hear the sounds from the surrounding environment. Such situations may include social situations in which it may appear impolite to have headphones on so that the user can't hear what others are saying. In other situations, it may simply be inconvenient to be completely isolated from external sound. For example, the user may be waiting to hear an announcement from a public address system.

It would be desirable to allow a user to adjust the extent to which the user may hear external sounds while wearing a portable audio device.

SUMMARY

In view of the above, a headphone accessory is provided for use with a portable audio device and headphones. The headphone accessory includes an audio source input for receiving audio signals from an audio device. An audio sound transducer receives external sounds and converts the external sound to external sound signals. A signal mixer for continuously varies the balance of a source audio volume to an external sound volume. The signal mixer mixes the volume-adjusted source audio signals with volume-adjusted external sound signals. An audio output outputs the mixed source audio and external sound signals.

In another aspect of the invention, a portable audio device is provided. The portable audio device includes a player unit having an audio output. The portable audio device connects to a headphone accessory that includes an audio source input for receiving audio signals from the player unit. An audio sound transducer receives external sounds and converts the external sound to external sound signals. A signal mixer for continuously varies the balance of a source audio volume to an external sound volume. The signal mixer mixes the volume-adjusted source audio signals with volume-adjusted external sound signals. An audio output outputs the mixed source audio and external sound signals to headphones connected to the audio output.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The examples of the invention described below can be better understood with reference to the following figures. The components in the figures are not necessarily to scale, emphasis instead being placed upon illustrating the principles of the invention. In the figures, like reference numerals designate corresponding parts throughout the different views.

FIG. 1A is a block diagram of a portable audio device 100 that may be used with an example ambient mixer.

FIG. 1B is a block diagram of another portable audio device 100' that may be used with an example ambient mixer.

DETAILED DESCRIPTION

Figure 2:
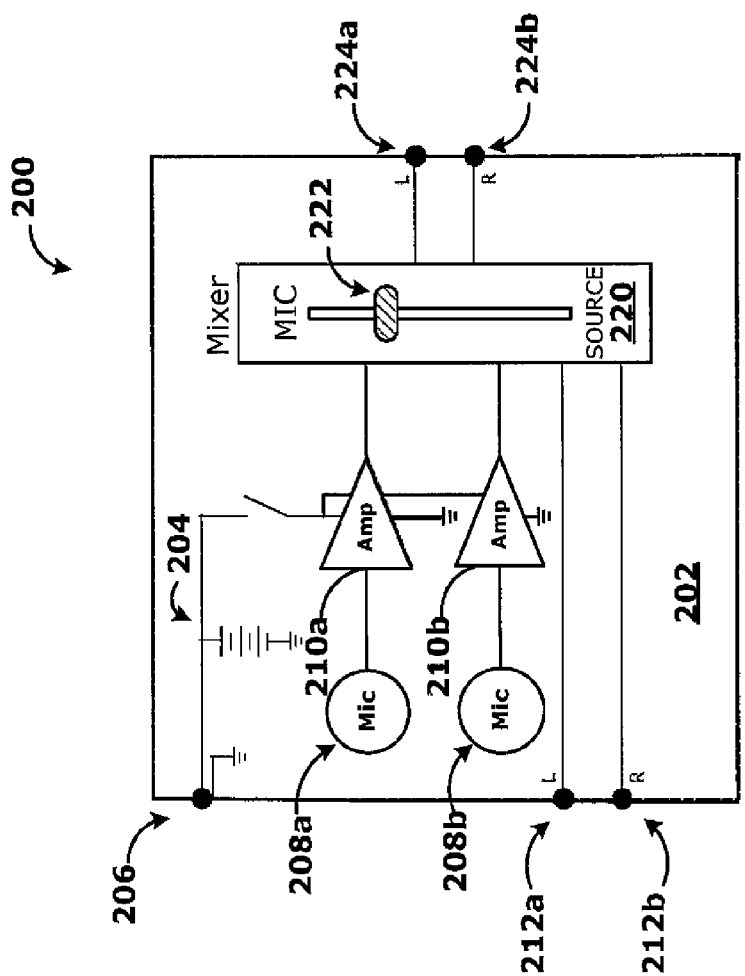
FIG. 2 is a schematic diagram of an example ambient mixer.

In the following description of example embodiments, reference is made to the accompanying drawings that form a part of the description, and which show, by way of illustration, specific example embodiments in which the invention may be practiced. Other embodiments may be utilized and structural changes may be made without departing from the scope of the invention.

FIG. 1A is a block diagram of a portable audio device 100 that may be used with an example ambient mixer. The portable audio device 100 includes a play unit 102, an ambient mixer 104, and headphones 108. The play unit 102 may be any portable audio player that may generate audio for personal listening using headphones 108. Examples of play units 102 that may be used in the portable audio device in FIG. 1A include portable radios; portable devices for playing audio tapes (for example, Walkman™), compact discs (CDs) (for example, DISCMAN™), and mini-audio discs; and portable devices for playing audio recorded in memory devices including solid state memory devices and magnetic storage devices (for example, iPod™).

Typical audio play units 102 include a stereo audio output having a left and right channel as shown in FIG. 1A. The stereo audio output is typically implemented as a female audio plug for receiving a single plug having connections to both right and left channels along a single line. FIG. 1A illustrates two lines, one each for the right and left channels, for purposes of clarity only. It is to be understood that audio play units 102 having any type of output may be used as well. For example, referring to FIG. 1B, a multi-channel audio play unit 101 may output in multiple channels 105, and may include a quadraphonic, or other multi-channel sources, with appropriate changes to the electrical connections. Examples of multi-channel sources 101 include portable DVD or Blu-eray players supporting 5.1 with discrete, non-digital outputs, or sources that synthesize additional surround channels from two-channel programs, using circuits such as Logic7™, or Dolby's Pro Logic™.

The ambient mixer 104 includes audio source inputs for the right and left channel source signals, at least one sound transducer, and outputs for the left and right channels to the headphones 108. The ambient mixer 104 receives the source audio signals from the audio play unit 102 over the right and left channel wires. The ambient mixer 104 also receives external sounds from the environment via right and left sound transducers 106a,b. The ambient mixer 106a includes a signal mixer that allows a user to control the relative volume of the sound from the right and left source signals, and from the right and left sound transducers 106a,b. The source and sound transducer signals are combined and coupled right and left channel wires that connect to the headphones 108.

The ambient mixer 104 includes a control mechanism, such as a slide switch, or a dial, or knob, or any other suitable device, which allows the user to adjust the volume of the external sounds relative to the volume of the source audio signals. The user may use the control mechanism to adjust the level of external sound being mixed with the source audio for reproduction by the headphones 108. The user may adjust the external sound level as desired according to the user's situation. If the user does not wish to hear any external sounds, the user may adjust the control mechanism to silence the external sounds. In one example implementation, a passive network is used to balance the volume of the source audio signal with the volume of the external sounds. The network is configured to decrease the volume of the source audio as the volume of the external sound is increased, and vice-versa. In another implementation, the ambient mixer 104 may be configured to increase or decrease only the external sound. In another implementation, the ambient mixer 104 may be configured to decrease the either the external sound or the source volume only when one of the other is at a maximum level. In this implementation, both source volume and external sound volume are at their maximum level at a center point. The source volume decreases in one direction of the control mechanism, and the external sound volume decreases in the other direction away from the center point.

FIG. 2 is a schematic diagram of an example ambient mixer 200. The ambient mixer 200 includes a lightweight housing (indicated by 202), a rechargeable battery 204 with a power switch, a charger input 206, a left microphone 208a, a right microphone 208b, a left microphone input amplifier 210a, a right microphone input amplifier 210b, a left channel source input 212a, a right channel source input 212b, a signal mixer 220, a left channel output 224a, and a right channel output 224b. In operation, the ambient mixer 200 in FIG. 2 may be connected to a play unit 102 (in FIG. 1A) at the left channel source input 212a and the right channel source input 212b, and to the headphones 108 (in FIG. 1A) at the left channel output 224a and the right channel output 224b.

The battery 204 may be used to power the amplifiers 210a,b in FIG. 2. The left and right microphones 208a,b may contain active elements that may also be powered by the battery 204. The signal mixer 220 may also include active elements that may be powered by the battery 204. The ambient mixer 200 may be provided with a battery charger that may be connected at charger input 206.

The sound transducers in the ambient mixer 200 in FIG. 2 are implemented using the left microphone 208a and right microphone 208b. In one example implementation, the left microphone 208a and right microphone 208b are implemented using dynamic, cardioid microphones. Dynamic microphones are inexpensive, robust, and require no external power. The left microphone 208a may be mounted on one side of the lightweight enclosure 202 and the right microphone 208b may be mounted on the opposite side of the enclosure 202. The microphones 208a,b may be mounted at locations on the enclosure such that in use, the user may feel a sense of direction of the external sounds. For example, the left microphone 208a may be mounted on the left side of the enclosure and the right microphone 208b on the right side of the enclosure 202 with the enclosure 202 oriented such that the left microphone 208a will pick up external sounds originating from the user's left and the right microphone 208b will pick up sounds originating from the user's right. In such an implementation, a cardioid microphone provides a good balance between directivity (for the aforementioned left-right localization) and omni-directionality (to pick up most external sounds.

Each microphone 208a,b is connected to a respective amplifier 210a,b, which provides a suitable level of signal gain. The amplifier's 210a,b are connected to left and right microphone inputs of the signal mixer 220. The signal mixer 220 includes balance control circuits to adjust the balance between the volume of external sounds picked up by the left microphone 208a and the audio source left channel signal, and the balance between the volume of external sounds picked up by the right microphone 208b and the audio source right channel signal. The signal mixer 220 includes a slide switch 222 that allows the user to set a balance between the volume of the source audio signal and the external sounds. Using the slide switch 222, the user may select to hear only the source audio by sliding the slide switch 222 all the way to the source side. The user may select to hear only the external sounds by sliding the slide switch 222 all the way to the microphone side. The user may also select to hear a mix of both external sounds and source audio in various proportions by sliding the slide switch 222 to a desired level between the source and microphone sides. The output signal includes a desired mix of the external sounds and the source audio at left and right outputs 224a,b.

The example implementation of the ambient mixer 200 in FIG. 2 is one example of an ambient mixer. Other implementations may also be used. For example, the ambient mixer 200 may include a single microphone, and accordingly, a single amplifier. Other implementations may also use different types of microphones. The amplifier may be optional in some examples, depending on the signal received from the microphone and on the extent of attenuation as the external sound electrical signal is processed by the ambient mixer 200, which may depend on the selection of the components used in the signal mixer 220.

Figure 3A:
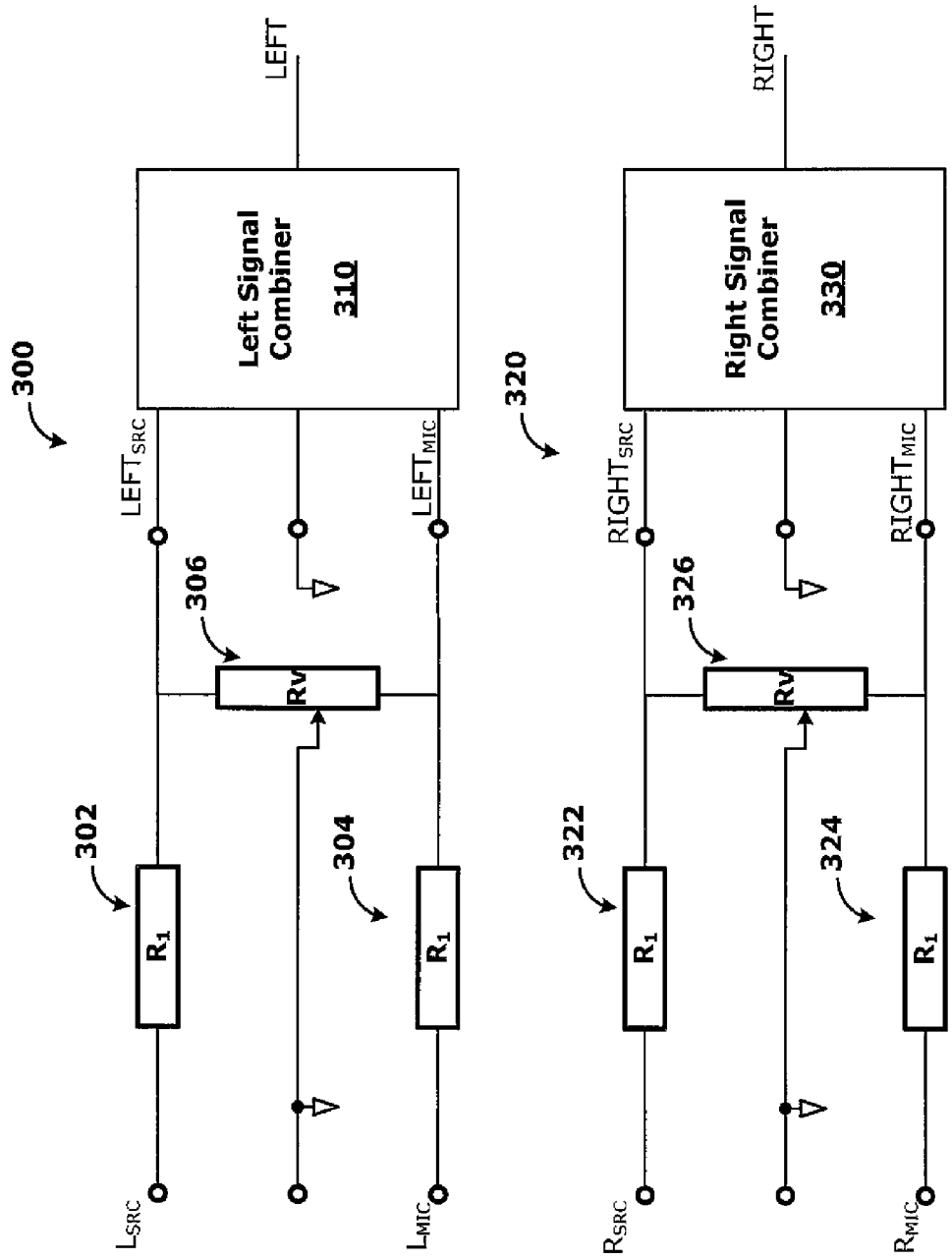
FIGS. 3A and 3B are schematic diagrams of examples of signal mixers that may be used in the example ambient mixer shown in FIG. 2.
Figure 3B:
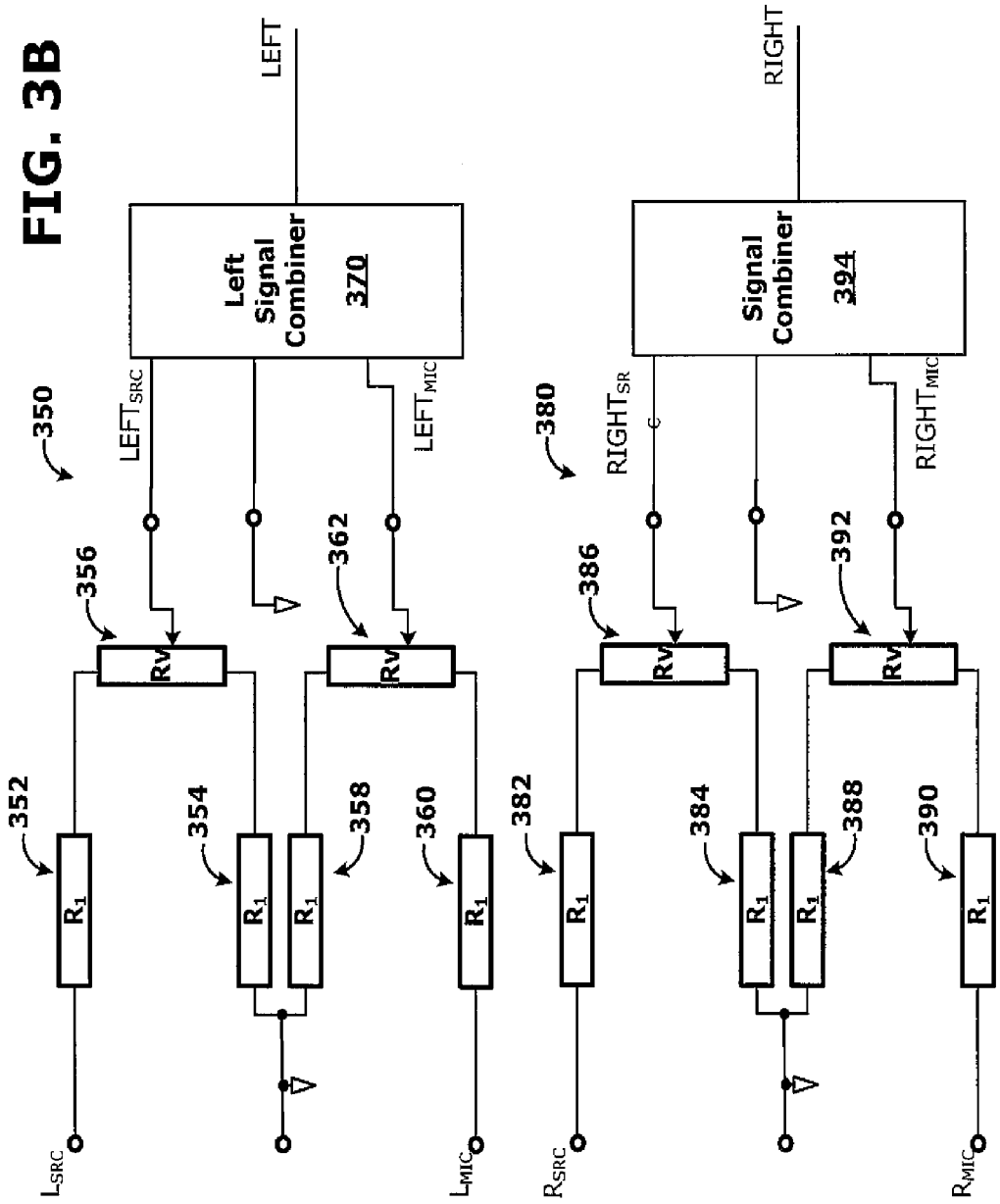

FIGS. 3A and 3B are schematic diagrams of examples of signal mixers that may be used in the example ambient mixer shown in FIG. 2. FIG. 3A shows a left channel signal mixer 300 and a right channel signal mixer 320. The left channel signal mixer 300 includes a first resistive element 302, a second resistive element 304 and a variable resistive element 306. The resistance values of the first and second resistive elements 302 and 304 are equal ($R_1$). The variable resistive element 306 varies according to the position of the control mechanism, which is grounded in the implementation shown in FIG. 3A. The right channel signal mixer 320 includes a first resistive element 322, a second resistive element 324 and a variable resistive element 326. The resistance values of the first and second resistive elements 322 and 324 are equal ($R_1$). The variable resistive element 326 varies according to the position of the control mechanism, which is grounded in the implementation shown in FIG. 3A. Operation of the signal mixers in FIG. 3A are described below as implemented in the example ambient mixer 200 in FIG. 2 to illustrate operation of the signal mixers. Signal mixers may be used in other schemes as well.

The first resistive element 302 is connected to the left audio source input (see FIG. 2) to receive the left audio source input signal. The second resistive element 304 is connected to the output of the left microphone input amplifier 210a, which receives the electrical signal representing the sound picked up by the left microphone 208a (in FIG. 2). The two resistive elements 302, 304 are connected to the variable resistive element $R_V$ 306. The control mechanism of the variable resistive element RV 306 is connected to ground. When the user slides the control mechanism towards either the source audio side or the microphone input side, the signal level at $LEFT_{SRC}$ changes linearly in relation to the signal level at $LEFT_{MIC}$. Moving the control mechanism to reduce the resistance between the node at $LEFT_{SRC}$ and the ground connection at the control mechanism of the variable resistive element 306 lowers the voltage level at the node at $LEFT_{SRC}$ and raises the voltage at the node at $LEFT_{MIC}$. Similarly, moving the control mechanism to reduce the resistance between the node at $LEFT_{MIC}$ and the ground connection at the control mechanism of the variable resistive element 306 lowers the voltage level at the node at $LEFT_{MIC}$ and raises the voltage at the node at $LEFT_{SRC}$. The voltages at the $LEFT_{MIC}$ and $LEFT_{SRC}$ nodes are coupled to a left signal combiner 310, which combines the signals and outputs the combined signal at the LEFT output.

The right channel mixer 320 operates in the same way as the left channel mixer 300. The control mechanism for the variable resistive element 306 may be mechanically coupled to the control mechanism for the variable resistive element 326 so that a single actuator may be used to adjust signal levels on both the left and right channels. Alternatively, the variable resister elements 306, 326 may be implemented using a single variable resister with sufficient taps to configure the variable resisters as shown in FIG. 3A.

FIG. 3B is another example of signal mixers that may be used in an ambient mixer such as the ambient mixer 200 in FIG. 2. FIG. 3B shows a left signal mixer 350 and a right signal mixer 380. The left signal mixer 350 includes a first resistive element 352, a second resistive element 354, a first variable resistive element 356, a third resistive element 358, a fourth resistive element 360, and a second variable resistive element 362. The right signal mixer 380 includes fifth resistive element 382, a sixth resistive element 384, a third variable resistive element 386, a seventh resistive element 388, an eighth resistive element 390, and a fourth variable resistive element 392. The first, second, third and fourth variable resistive elements 356, 362, 386, 392 may operate similar to the variable resistive elements 306 and 326.

The left signal mixer 350 receives the left channel source input signal at the first resistive element 352 and the electrical signal from the sound picked up by the left microphone at the fourth resistive element 345. The user adjusts the control mechanisms of the first and second variable resister elements 356, 362 to adjust the signal level at the $LEFT_{SRC}$ node relative to the signal level at the $LEFT_{MIC}$ node. Moving the control mechanism of the first and second variable resistive elements 356, 362 up increases the resistance between the $LEFT_{SRC}$ node and the ground connection and decreases the resistance between the $LEFT_{MIC}$ node and the ground connection. Thus, moving the control mechanism up increases the voltage at the $LEFT_{SRC}$ node and decreases the voltage at the $LEFT_{MIC}$ node. The user increases the volume of the sound from the left channel source audio input and decreases the volume of the external sound picked up by the left microphone by moving the control mechanism of the variable resister elements 356, 362 up.

Moving the control mechanism of the first and second variable resistive elements 356, 362 down increases the resistance between the $LEFT_{MIC}$ node and the ground connection and decreases the resistance between the $LEFT_{SRC}$ node and the ground connection. Thus, moving the control mechanism down increases the voltage at the $LEFT_{MIC}$ node and decreases the voltage at the $LEFT_{SRC}$ node. The user decreases the volume of the sound from the left channel source audio input and increases the volume of the external sound picked up by the left microphone by moving the control mechanism of the variable resister elements 356, 362 up.

The right signal mixer 380 operates in the same manner as the left signal mixer 350. The control mechanism for the four variable resistive elements 356, 362, 386, 392 in FIG. 3B may be mechanically coupled so that a single actuator may be used to adjust signal levels on both the left and right channels. Alternatively, the four variable resister elements 356, 362, 386, 392 may be implemented using a single variable resister with sufficient taps to configure the variable resisters as shown in FIG. 3B. The voltages at the $LEFT_{MIC}$ and $LEFT_{SRC}$ nodes are coupled to a left signal combiner 370, which combines the signals and outputs the combined signal at the LEFT output. The voltages at the $RIGHT_{MIC}$ and $RIGHT_{SRC}$ nodes are coupled to a right signal combiner 394, which combines the signals and outputs the combined signal at the RIGHT output.

FIGS. 3A and 3B illustrate example passive signal mixers for use in an ambient mixer such as the ambient mixer 200 in FIG. 2. The signal mixers 350, 380 in FIG. 3B result in lower insertion loss. An active approach may be used as well, however, at the cost of reducing battery life. The variable resisters may have a linear or log taper.

It is noted that examples of ambient mixers have been described above as operating with a portable audio device. Use of the ambient mixers need not be limited to audio devices that are portable. For example, one additional use may include connecting an example ambient mixer to an audio outlet on an airplane.

The foregoing description of an implementation has been presented for purposes of illustration and description. It is not exhaustive and does not limit the claimed inventions to the precise form disclosed. Modifications and variations are possible in light of the above description or may be acquired from practicing the invention. Note also that the implementation may vary between systems. The claims and their equivalents define the scope of the invention.

What is claimed:
1. A headphone accessory comprising:
an audio source input for receiving audio signals from an audio device;
an audio sound transducer for receiving external sounds and converting the external sound to external sound signals;
a signal mixer for varying the balance of a source audio volume to an external sound volume by increasing one of the source audio volume and the external sound volume while decreasing the other of the source audio volume and the external sound volume in response to a user control, and for mixing volume-adjusted source audio signals with volume-adjusted external sound signals; and an audio output for outputting the mixed source audio and external sound signals.

2. The headphone accessory of claim 1 where the audio source input includes a right audio input and a left audio input.

3. The headphone accessory of claim 2 wherein the audio sound transducer includes a first audio sound transducer and a second audio sound transducer, wherein the first audio sound transducer is configured as a right external sound pickup and the second audio sound transducer is configured as a left external sound pickup.

4. The headphone accessory of claim 3 where:

the signal mixer varies the balance of a right source audio volume to a right external sound volume under user control, the signal varies the balance of a left source audio volume to a left external sound volume under user control, and the signal mixer mixes volume-adjusted right source audio with volume-adjusted right external sound to output to a right channel audio output, and volume-adjusted left source audio with volume-adjusted left external sound to output to a left channel audio output.

5. The headphone accessory of claim 1 where the audio source input is configured to receive audio signals from the audio device, where the audio device includes a multi-channel source selected from a group consisting of quadraphonic source, a DVD player with 5.1 audio outputs, a Blueray™ player with 5.1 audio outputs, and sources that synthesize additional surround channels from two-channel programs using circuits such as Logic7™, or Dolby's Pro Logic™.

6. The headphone accessory of claim 1 where the signal mixer uses a passive resistive network that includes a potentiometer for varying the balance of the volumes.

7. A portable audio device comprising:

a player unit having an audio output;

a headphone accessory having:

an audio source input for receiving audio signals from the player unit;

an audio sound transducer for receiving external sounds and converting the external sound to external sound signals;

a signal mixer for varying the balance of a source audio volume to an external sound volume by increasing one of the source audio volume and the external sound volume while decreasing the other of the source audio volume and the external sound volume in response to a user control, and for mixing volume-adjusted source audio signals with volume-adjusted external sound signals; and an audio output for outputting the mixed source audio and external sound signals; and headphones connected to the audio output.

8. The portable audio device of claim 7 where the audio output of the player unit includes a right channel and a left channel, and the audio source input of the headphone accessory includes a right audio input to connect to the right channel, and a left audio input to connect to the left channel.

9. The portable audio device of claim 8 wherein the audio sound transducer includes a first audio sound transducer and a second audio sound transducer, wherein the first audio sound transducer is configured as a right external sound pickup and the second audio sound transducer is configured as a left external sound pickup.

10. The portable audio device of claim 9 where in the headphone accessory:

the signal mixer varies the balance of a right source audio volume to a right external sound volume under user control, the signal mixer varies the balance of a left source audio volume to a left external sound volume under user control, and the signal mixer mixes volume-adjusted right source audio with volume-adjusted right external sound to output to a right channel audio output, and volume-adjusted left source audio with volume-adjusted left external sound to output to a left channel audio output.

11. The portable audio device of claim 7 where the player unit is a multi-channel source selected from a group consisting of a quadraphonic source, a DVD player with 5.1 audio outputs, a Blueray™, player with 5.1 audio outputs, and sources that synthesize additional surround channels from two-channel programs, using circuits such as Logic7™, or Dolby's Pro Logic™.

12. The portable audio device of claim 7 where the signal mixer in the headphone accessory uses a passive resistive network that includes a potentiometer for varying the balance of the volumes.

13. The headphone accessory of claim 1 wherein the signal mixer is configured for varying the balance of the source audio volume to the external sound volume such that the source audio volume is linearly related to the external sound volume.

14. The headphone accessory of claim 1 further comprising a control mechanism coupled to the signal mixer and adapted to receive the user control.

15. The headphone accessory of claim 14 wherein the signal mixer comprises:

a first circuit coupled to the audio source input for receiving the audio signals and having a first resistance corresponding to the source audio volume;

a second circuit coupled to the audio sound transducer for receiving the external sound signals and having a second resistance corresponding to the external sound volume; and a variable resistor coupled to the control mechanism and connected to the first circuit and to the second circuit for adjusting the first resistance and the second resistance in response to the user control.

16. The headphone accessory of claim 15 wherein the signal mixer further comprises a signal combiner, and wherein the signal combiner is configured to:

receive the volume adjusted source audio signals from the first circuit;

receive the volume-adjusted external sound signals from the second circuit;

mix the volume adjusted source audio signals and the volume-adjusted external sound signals; and output the mixed source audio and external sound signals.

17. The portable audio device of claim 7 wherein the headphone accessory further comprises a control mechanism coupled to the signal mixer and adapted to receive the user control.

18. The portable audio device of claim 17 wherein the signal mixer comprises:

a first circuit coupled to the audio source input for receiving the audio signals and having a first resistance corresponding to the source audio volume;

a second circuit coupled to the audio sound transducer for receiving the external sound signals and having a second resistance corresponding to the external sound volume; and a variable resistor coupled to the control mechanism and connected to the first circuit and to the second circuit for adjusting the first resistance and the second resistance in response to the user control.

19. The portable audio device of claim 18 wherein the signal mixer further comprises a signal combiner, and wherein the signal combiner is configured to:

receive the volume adjusted source audio signals from the first circuit;

receive the volume-adjusted external sound signals from the second circuit;

mix the volume adjusted source audio signals and the volume-adjusted external sound signals; and output the mixed source audio and external sound signals.

20. A portable audio device comprising:

a headphone accessory having:

an audio source input for receiving audio signals from a player unit;

an audio sound transducer for receiving external sounds and converting the external sound to external sound signals;

a signal mixer for varying the balance of a source audio volume to an external sound volume by increasing one of the source audio volume and the external sound volume while decreasing the other of the source audio volume and the external sound volume in response to a user control, and for mixing volume-adjusted source audio signals with volume-adjusted external sound signals; and an audio output for outputting the mixed source audio and external sound signals; and at least one headphone for connecting to the audio output.

* * * * *